United States Patent [19]

Masuoka et al.

[11] Patent Number: 4,710,897

[45] Date of Patent: Dec. 1, 1987

[54] SEMICONDUCTOR MEMORY DEVICE COMPRISING SIX-TRANSISTOR MEMORY CELLS

[75] Inventors: Fujio Masuoka; Kiyofumi Ochii, both of Yokohama, Japan

[73] Assignee: Kabushiki Kaisha Toshiba, Kawasaki, Japan

[21] Appl. No.: 726,698

[22] Filed: Apr. 24, 1985

[30] Foreign Application Priority Data

Apr. 27, 1984 [JP] Japan .................................. 59-85617
Apr. 27, 1984 [JP] Japan .................................. 59-85618
Nov. 30, 1984 [JP] Japan .................................. 59-253026
Nov. 30, 1984 [JP] Japan .................................. 59-253027

[51] Int. Cl.$^4$ ................... H01L 27/10; H01L 29/04; H01L 23/50; G11C 11/40
[52] U.S. Cl. .................................. 365/182; 365/154; 357/42; 357/59; 357/71; 307/272.2
[58] Field of Search ......... 357/59 I, 42, 59 J, 357/71; 365/154, 182; 307/272 A

[56] References Cited

U.S. PATENT DOCUMENTS 4,233,672 11/1980 Suzuki et al. ........................ 357/42
4,333,099 6/1982 Tanguay et al. .................... 357/59 I
4,481,524 11/1984 Tsujide ................................ 357/42
4,613,886 9/1986 Chwang ............................. 357/42

FOREIGN PATENT DOCUMENTS 0021400 1/1981 European Pat. Off. ............. 357/59
0098737 1/1984 European Pat. Off. ............. 357/42
3002343 7/1980 Fed. Rep. of Germany ........ 357/42
57-23260 2/1982 Japan .................................... 357/42
57-152161 9/1982 Japan .................................... 357/42

OTHER PUBLICATIONS

Dingwall et al., "High-Density, Buried-Contact CMOS/SOS Static RAM's", 1978, IEDM, 193-196.
K. Ochii et al., "An Ultralow Power 8K×8-Bit Full CMOS RAM with a Six-Transistor Cell," IEEE Journal of Solid-State Circuits, vol. SC-17, No. 5, Oct. 1982.
C. Anagnostopoulos et al., "Latch-Up and Image Crosstalk Suppression by Internal Gettering," IEEE Journal of Solid-State Circuits, vol. SC-19, No. 1, Feb. 1984.
Patent Abstracts of Japan, vol. 5, No. 125, Aug. 12, 1981, p. (E-69) (797), Referencening JP-A-56-61158, (Suwa Seikosha), May 26, 1981.
PCT Publication WO81/02222 of Aug. 6, 1981.

Primary Examiner—Andrew J. James
Assistant Examiner—John Lamont
Attorney, Agent, or Firm—Finnegan, Henderson, Farabow, Garrett & Dunner

[57] ABSTRACT

The gate electrode of a first CMOS inverter is connected to the drains of each transistor of a second CMOS inverter via an interconnection, and the gate electrode of the second CMOS inverter is connected to the drains of the first CMOS inverter via an interconnection, to form a flip-flop circuit. A pair of transfer transistors are connected to the nodes of this flip-flop circuit. A plurality of memory cells each constructed by the flip-flop circuit and the pair of transfer transistors are integrated in a matrix form to form a semiconductor memory device. The pair of gate electrodes are formed of a first polycrystalline silicon layer which includes an impurity of the first conductivity type. The pair of interconnections are formed of an impurity-doped second polycrystalline silicon layer and a high-melting point metal layer, and formed on a first interlayer insulation film. The high-melting point metal layer is provided to prevent an increase in the resistance value due to the formation of a pn junction formed by the interconnections.

16 Claims, 15 Drawing Figures

F I G. 12
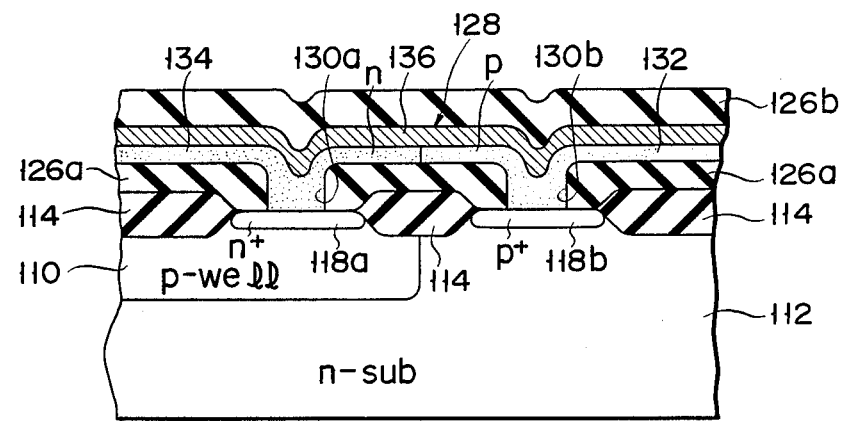
F I G. 13
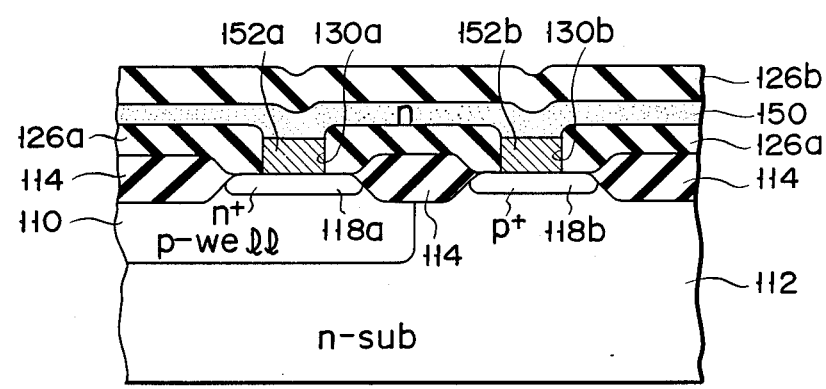

F I G. 14
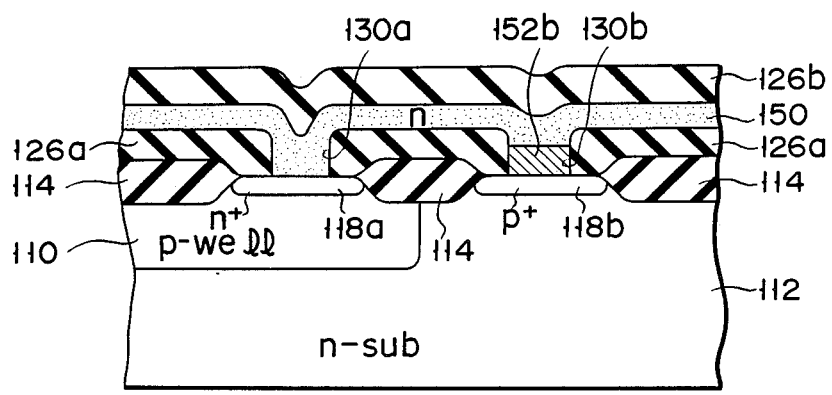
F I G. 15
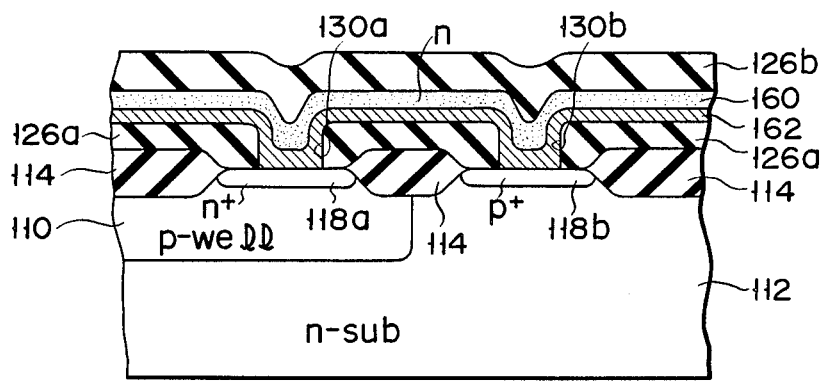

SEMICONDUCTOR MEMORY DEVICE COMPRISING SIX-TRANSISTOR MEMORY CELLS

BACKGROUND OF THE INVENTION

This invention relates to a semiconductor memory device and, more particularly, to a semiconductor memory comprising a matrix of six-transistor memory cells.

A prior art CMOS RAM with six-transistor memory cells is disclosed in Ochii et al., "An Ultralow Power 8K×8K Bit Full CMOS RAM with a Six-transistor Cell," IEEE Journal of Solid-State Circuits, vol. SC-17, No. 5, October 1982, (pp. 798–803, FIGS. 3 and 11).

In FIG. 1, a six-transistor memory cell is shown. In that figure, Qp1 and Qn1 are p channel and n channel MOS transistors, respectively, which form a first CMOS inverter, and Qp2 and Qn2 are p-channel and n-channel MOS transistors, respectively, which form a second CMOS inverter. The gate of the first CMOS inverter is connected to the drain of each transistor of the second CMOS inverter, and the gate of the second CMOS inverter is connected to the drain of the first CMOS inverter to form a flip-flop circuit. The source of each p channel MOS transistor Qp1, Qp2 is connected to a voltage source VDD, and the source of each n channel MOS transistor Qn1 and Qn2 is connected to another voltage source VSS. The drains of transistors Qp1 and Qn1, and of transistors Qp2 and Qn2 are set at VDD and VSS potential, respectively, for holding data. For example, when the drains of Qp1, Qn1 are at VDD potential, QP2 is OFF and Qn2 is ON, and then drains of Qp2, Qn2 are at VSS potential, resulting that Qp1 is ON and Qn1 is OFF.

Qn3, Qn4 are n channel MOS transistors which operate as transfer gates. A source of Qn3 is connected to the node of the first CMOS inverter and a source of Qn4 is connected to that of the second CMOS inverter. Bit lines BL1, BL2 are connected to the drain side of transistors Qn3, Qn4, respectively. The gates of Qn3 and Qn4 are connected to word line WL. When Qn3 and Qn4 are ON for memory cell selection and reading and writing, the bit lines BL1, BL2 connected to their drains transmit data to and from the flip flop circuit.

When data is written into this memory cell, e.g., when the drains of the transistors Qp1, Qn1 are set at VSS potential and the drains of Qp2, Qn2 are set at VDD potential, bit line BL1 is at VSS level, BL2 is at VDD level, and Qn3 and Qn4, which operate as transfer gates, are turned ON by word line WL. For read out, on the other hand, bit lines BL1 and BL2 are connected to a sense amplifier (not shown) and then transistors Qn3, Qn4 are turned ON.

The connections between the transistors of the above memory cell are as follows. The gates of Qp1 and Qn1 are formed of GATE 1, which is formed as a unit with a first polycrystalline silicon layer, while the gates of transistors Qp2, Qn2 are formed of GATE 2, which is formed as a unit with the first polycrystalline silicon layer. The source of Qn1 is connected to VSS1 line which is formed of a second polycrystalline silicon layer, and the source of Qn2 is connected to VSS2 line, which is also formed of the second polycrystalline silicon layer. The drains of Qp1 and Qn1 are connected to Al interconnection INTC1, and the drains of Qp2, Qn2 are connected to Al interconnection INTC2. The drains of Qn3 and Qn4 are connected to Al bit lines BL1 and BL2, respectively. As can be seen in FIG. 1, lines VSS1, VSS2, BL1, BL2 and interconnections INTC1 and INTC2 are arranged in the same direction.

The gates of Qn3, Qn4 form the word line WL, which is formed as a unit with the first polycrystalline silicon layer. This word line WL is provided at right angles to the above lines VSS1, VSS2, BL1, BL2 and interconnections INTC1, INTC2. Accordingly, with the prior art memory cell, four Al interconnections (interconnection INTC1, INTC2, bit lines BL1, BL2) are formed on the interlayer insulation layer on the second polycrystalline silicon layer, resulting in a large memory cell pitch width.

Furthermore, with the prior art memory device shown in FIG. 1, one Al VSS3 line, which is, for example, for 8 cells, is provided in the same direction as Al lines INTC1, INTC2, BL1 and BL2. VSS3 line supplies VSS potential to the substrate regions of transistors Qn1, Qn2 formed in the p-well to prevent latch up phenomenon, i.e., to prevent the thyristor effect. For details of this latch up phenomenon refer to "Latch-Up and Image Crosstalk Suppression by Internal Gettering" Constantine N. Anagnostopoulos et al., IEEE Journal of Solid-State Circuits, vol. sc-19, No. 1, February 1984 (pp91–97).

In order to effectively prevent latch up, it is desirable to provide a VSS3 line for each memory cell. If this is done, however, one more Al interconnection is required, increasing the element area required. As a result of this trade off, one VSS3 line was provided for every 8 cells, for example. Accordingly, with the device as a whole, if one more Al interconnection line is required for every 8 cells, increasing the integration of the device is extremely difficult. Also, as only one Al VSS3 line is provided for every eight memory cells, it is impossible to sufficiently increase the resistance to latch up.

SUMMARY OF THE INVENTION

The object of this invention is to provide a semiconductor memory device comprising a six-transistor memory cell with a pair of cross-coupled CMOS inverters formed of four of the transistors in which the memory cell pitch width is reduced, the memory cells themselves are made compact, and the resistance for latch up is drastically improved.

In order to achieve this object, a semiconductor memory device is provided, in which the six-transistor memory cells are provided in a matrix form, each cell comprising:

a first-channel type first MOS transistor having a source, drain, gate and substrate region;

a second-channel type second MOS transistor having a source, drain, gate and substrate region, the gates of said first and second MOS transistors being formed of a first portion of a first polycrystalline silicon layer, which includes impurities for providing conductivity, and being electrically connected, said first and second MOS transistors forming a first CMOS inverter;

a first-channel type third MOS transistor having a source, drain, gate and substrate region;

a second-channel type fourth MOS transistor having a source, drain, gate and substrate region, the gates of said third and fourth MOS transistors being formed of a second portion of the first polycrystalline silicon layer, which includes impurities for providing conductivity, and being electrically connected, said third and fourth MOS transistors forming a second CMOS inverter;

a second-channel type fifth MOS transistor, for data transfer, having a source, drain, gate and substrate region, the source of said fifth MOS transistor being connected to the drain of said second MOS transistor;

a second-channel type sixth MOS transistor, for data transfer, having a source, drain, gate and substrate region, the source of said sixth MOS transistor being connected to the drain of said fourth MOS transistor, and the gates of said fifth and sixth MOS transistors being connected to a word line;

first potential supplying means for supplying a first potential to the sources of said first and third MOS transistors;

first connection means for connecting each the gate of said first MOS transistor, the drain of said third MOS transistor, and the drain of said fourth MOS transistor via contact holes, said first connection means being formed of an impurity-doped first portion of a second polycrystalline silicon layer and a first high-melting point metal layer and formed on a first interlayer insulation film formed on the first and second portions of the first polycrystalline silicon layer, said first high-melting point layer being arranged to prevent an increase in the resistance value caused by a pn junction formed between the gate of said first MOS transistor, the gate of said second MOS transistor, the drain of said third MOS transistor, and the drain of said fourth MOS transistor;

second connection means for connecting each the gate of said third MOS transistor, the drain of said first MOS transistor, and the drain of said second MOS transistor via contact holes, said second connection means being formed of an impurity-doped second portion of a secnd polycrystalline silicon layer and a second high-melting point metal layer and formed on said first interlayer insulation film, said second high-melting point layer being arranged to prevent an increase in the resistance value caused by a pn junction formed between the gate of said third MOS transistor, the gate of said fourth MOS transistor, the drain of said first MOS transistor, and the drain of said second MOS transistor;

a first metal interconnection layer for supplying a second potential to the source of said second MOS transistor via a contact hole provided in a second interlayer insulation layer formed on said first and second connection means;

a second metal interconnection layer for supplying a second potential to the source of said fourth MOS transistor via a contact hole provided in the second interlayer insulation layer, said first and second metal interconnection layers being shared by adjacent memory cells;

a third metal interconnection layer, connected to the drain of said fifth MOS transistor via a contact hole formed in said second interlayer insulation layer, for functioning as a first bit line; and a fourth metal interconnection layer, connected to the drain of said sixth MOS transistor via a contact hole formed in said second interlayer insulation layer, for functioning as a second bit line.

With this kind of construction, a high integrated and highly reliable static memory device, in which the pitch of the memory cells is reduced, the size of the memory cells themselves is reduced, and latch up resistance is remarkably improved, can be provided.

BRIEF DESCRIPTION OF THE DRAWINGS

Other objects and advantages will be apparent from the following description taken in conjunction with the accompanying drawings in which:

FIGS. 12 to 15 are cross-sectional views of a CMOS device of an expanded embodiment of this invention.

DETAILED DESCRIPTION OF THE PREFERRED EMBODIMENTS

Figure 1:
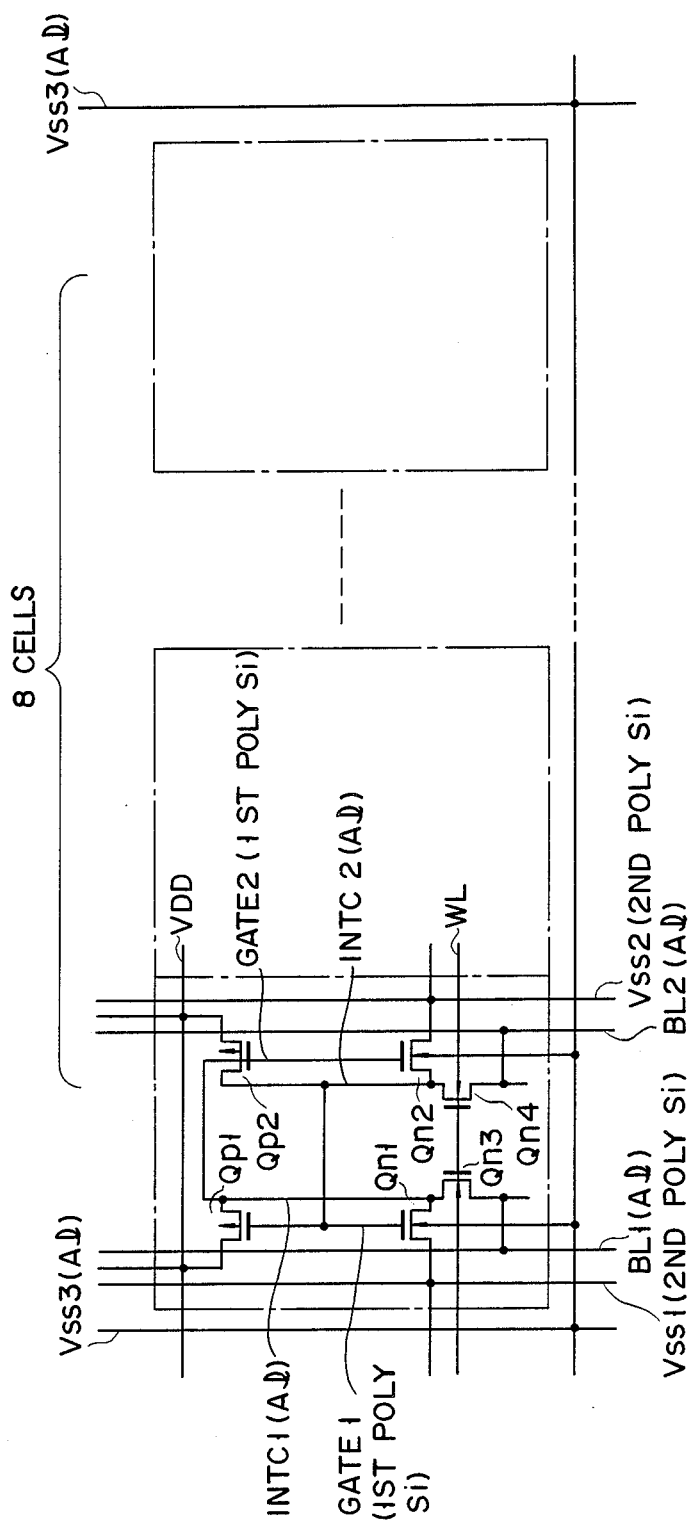
FIG. 1 is a circuit diagram of a prior art semiconductor memory device comprising six-transistor memory cells.
Figure 2:
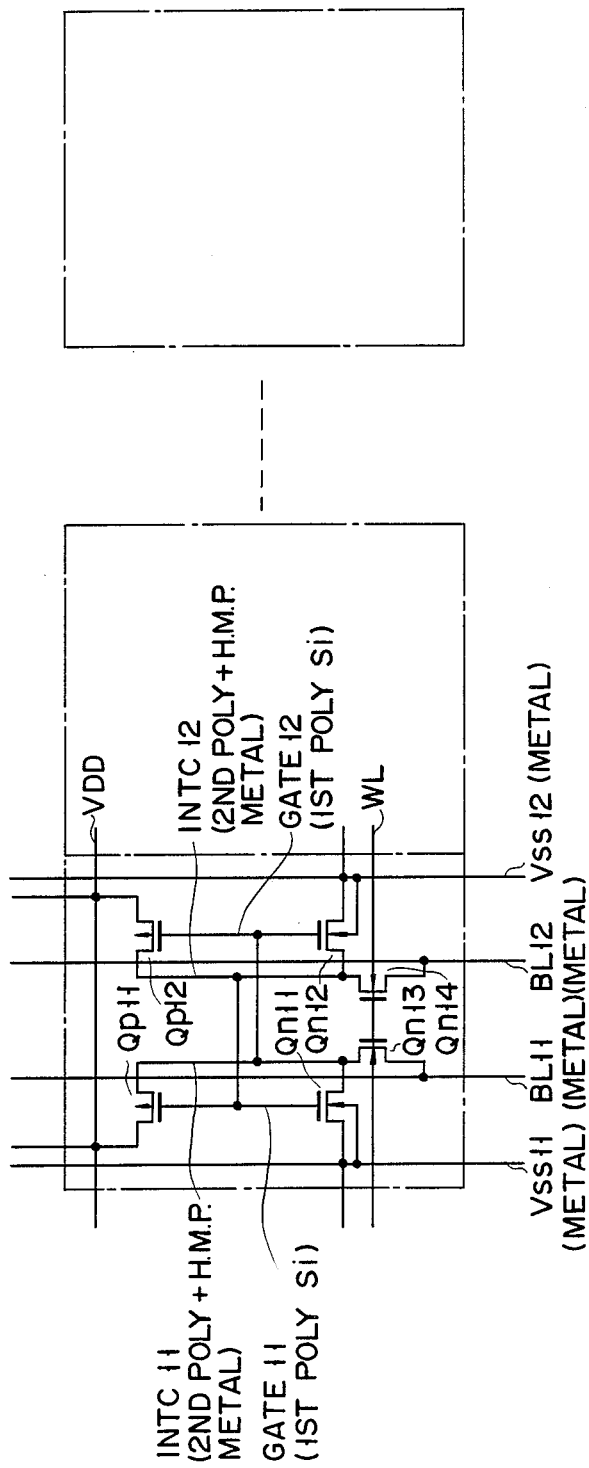
FIG. 2 is a circuit diagram of the six-transistor semiconductor memory device comprising six-transistor memory cells of this invention.

The following is a description of the main points of this invention, comparing the device shown in FIG. 2 with the prior art device shown in FIG. 1.

In the drawings, Qp11, Qn11 are the p and n channel MOS transistors that form a first CMOS inverter, and Qp12, Qn12 form a second CMOS inverter. Transistors Qn11, Qn12 are formed in a p-well in a semiconductor substrate. The gate of the first CMOS inverter is connected to the drains of each of the transistors of the second CMOS inverter and the gate of the second CMOS inverter is connected to the drains of each of the transistors of the first CMOS inverter thereby forming a flip-flop circuit The sources of the p-channel transistors Qp11, Qp12 are connected to VDD and the sources of the n-channel MOS transistors are connected to VSS. The drains of Qp11, Qn11 and the drains of Qp12, Qn12 are set to VDD and VSS, respectively, for holding data. For example, when the drains of Qp11, Qn11 are at VDD potential, Qp12 is OFF and Qn12 is ON. Therefore, the drains of Qp12, Qn12 are set at VSS potential, and then Qp11 is ON and Qn11 is OFF.

Qn13, Qn14 are n-channel transistors that function as transfer gates. Qn13 is connected to the node of the first CMOS inverter and Qn14 is connected to the node of the second CMOS inverter. Bit lines BL11, BL12 are connected to the drains of Qn13, Qn14, respectively, and the gates of Qn13, Qn14 are connected to word line WL. Qn13 and Qn14 are ON for memory cell selection and reading and writing, and the bit lines BL11, BL12 connected to their drains transmit data to and from the flip flop circuit.

When data is written into this memory cell, e.g., when the drains of the transistors Qp11, Qn11 are set at VSS potential and the drains of Qp12, Qn12 are set at VDD potential, bit line BL is at VSS level, BL12 is at VDD level, and Qn13 and Qn14, which operate as transfer gates, are turned ON by word line WL. For read out, on the other hand, bit lines BL11 and BL12 are connected to a sense amplifier (not shown) and then transistors Qn13, Qn14 are turned ON.

The connections between the transistors of the above memory cell are as follows. The gates of Qp11 and Qn11 are formed of GATE 11, which is formed as a unit with a first polycrystalline silicon layer, while the gates of transitors Qp12, Qn12 are formed of GATE 12, which is formed as a unit with the first polycrystalline silicon layer. The drain of Qp11, the drain of Qn11 and GATE 12 are connected to an interconnection INCT11, which is formed of a second polycrystalline silicon layer and a high-melting point metal layer. The drain of Qp12 and the drain of Qn12 are connected to an interconnection INTC12, which made of the second polycrystalline silicon layer and a high-melting point metal layer. The source and the substrate region of Qn11 are connected to VSS11 line which is formed of metal, and the source and the substrate region of Qn12 are connected to VSS12 line, which is made of metal. VSS11 line and VSS12 line are shared by adjacent memory cells. The drain of Qn13 is connected to the metal bit line BL11, and the drain of Qn14 is connected to the metal bit line BL12. The gates of Qn13, Qn14 are formed of the first polycrystalline silicon layer to form the word line WL.

With this kind of a structure, three metal interconnections per memory cell are required so that the pitch of the memory cells is reduced, and the integration of the memory device can be increased. A bias potential is supplied via VSS11, VSS12 lines to the substrate regions of Qn11, Qn12 formed in the p-well so that the resistance to latch up is increased, the additional interconnection line VSS3 of the prior art is unnecessary, and improving the integration.

Figure 3:
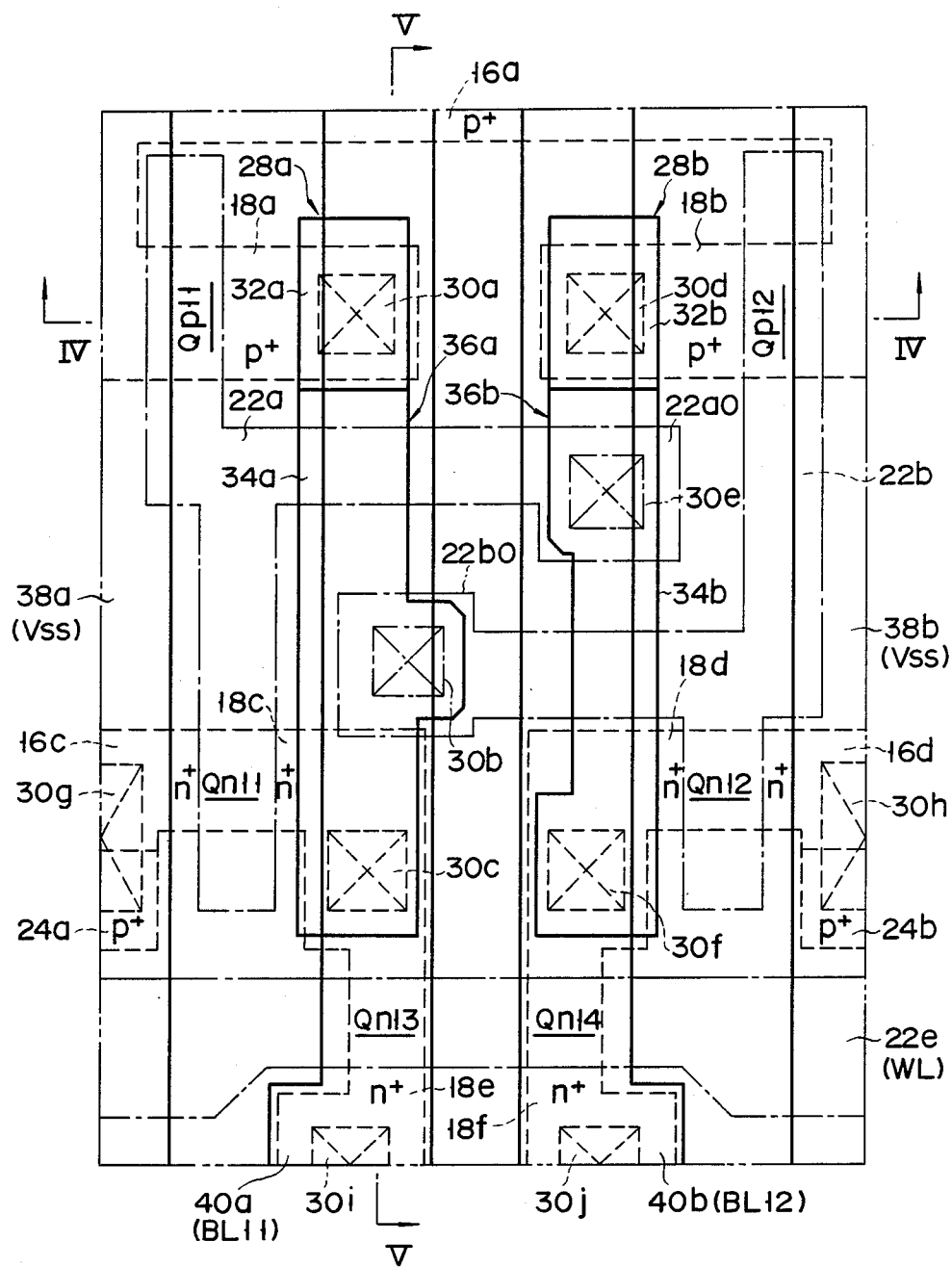
FIG. 3 is a plan view of the semiconductor memory device according to a first embodiment of this invention.
Figure 4:
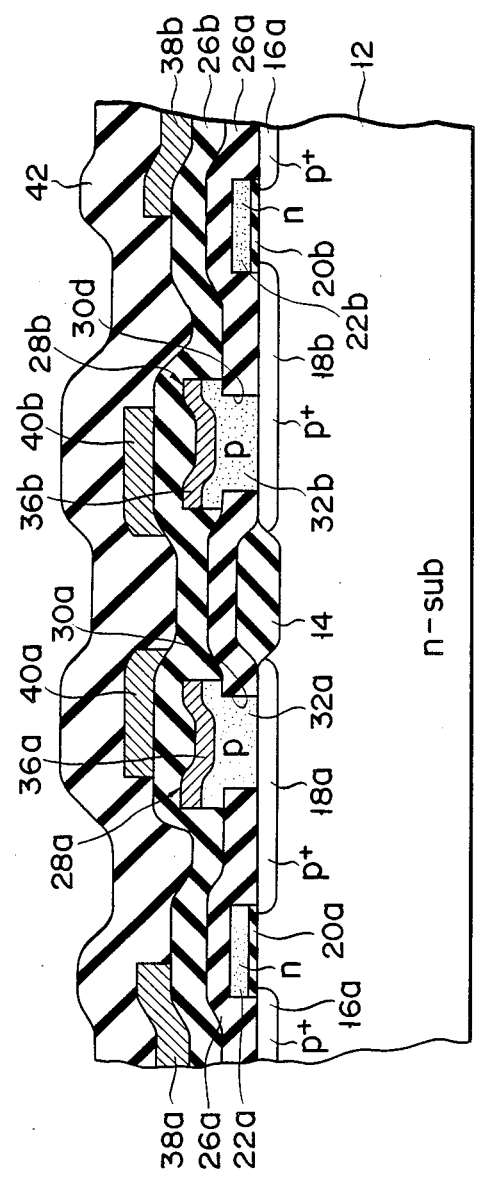
FIG. 4 is a cross-sectional view taken along line IV—IV of FIG. 3.
Figure 5:
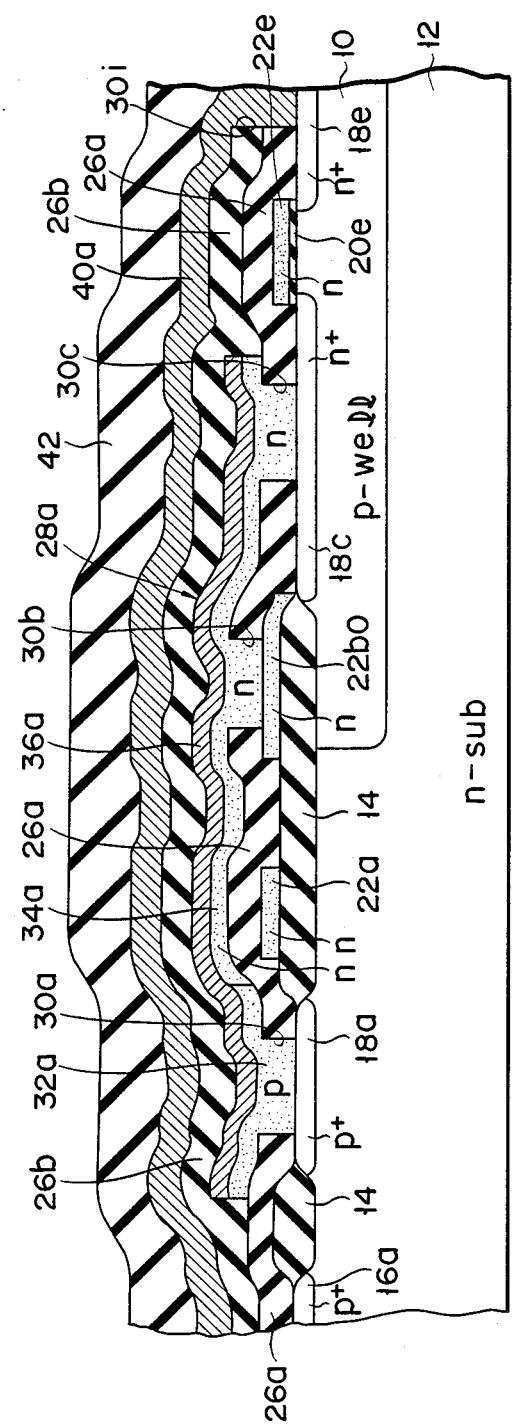
FIG. 5 is a cross-sectional view taken along line V—V of FIG. 3.

The following is a description with reference to FIGS. 3 to 5 of the first embodiment of the semiconductor memory device of this invention.

In the drawings, Qp11, Qn11 are the p and n channel MOS transistors that form a first CMOS inverter, and Qp12, Qn12 form a second CMOS inverter. The common gate of the one CMOS inverter is cross connected to the common drain section of the other CMOS inverter to form a flip-flop circuit. Qn13, Qn14 are n channel MOS transistors connected to the drains of MOS transistors Qn11, Qn12, respectively, and function as transfer gates.

As shown in FIGS. 3 and 4, Qp11 and Qp12 are formed is islands in an n-type silicon substrate 12 in which p-wells are selectively formed. The island is isolated by field oxide film 14. Qp11 is formed of p+ type source region 16a and drain region 18a formed electrically separated in the island in silicon substrate 12, and gate electrode 22a, which is formed of a first n-type polycrystalline silicon layer doped with phosphorus, for example, in common with the gate of Qn11. Gate electrode 22a is arranged, via gate oxide film 20a, on substrate 12 which includes a channel region between source and drain 16a, 18a. The other transistor Qp12 is formed of p+ type source region 16a and drain region 18b formed electrically isolated in the island in silicon substrate 12, and gate electrode 22b, which is formed of the first n-type polycyrstalline silicon layer doped with phosphorus, for example, in common with the gate of Qn12. Gate electrode 22b is arranged, via gate oxide film 20b, on substrate 12 which includes a channel region between source and drain 16a, 18b. P+ source region 16a is shared by both Qp11 and Qp12 and fucntions as the VDD line.

Qn11, Qn12 are formed in the island-shaped p-well region 10, which is isolated by field oxide film 14. Qn11 is formed of n+ type source regions 16c and drain region 18c formed electrically isolated in the island-shaped p-well region 10, and gate electrode 22a, which is formed of the first n-type polycrystalline silicon layer. Gate electrode 22a is arranged, via gate oxide film (not shown), on p-well region 10 which includes a channel region between source and drain 16c, 18c. Qn12 is formed of n+ type source region 16d and drain region 18d formed electrically isolated in the island-shaped p-well region 10, and gate electrode 20b, which is formed of the first n-type polycrystalline silicon layer. Gate electrde 20b is arranged, via gate oxide film (not shown), on p-well region 10 which includes a channel region between source and drain 16d, 18d.

Qn13, which functions as a transfer gate, is formed of n+ type source region common with drain region 18c and drain region 18e formed electrically isolated in the island-shaped well region 10, and gate electrode 22e, which is formed of the first n-type polycrystalline silicon layer doped with phosphorus, for example, and is common to Qn14, as shown in FIG. 5. Gate electrode 22e is arranged, via gate oxide film 20e, on well region 10 which includes a channel region between source and drain 18c, 18e. Qn13 is formed of n+ type source region common with drain region 18d and drain region 18f formed electrically isolated in the island-shaped well region 10, and gate electrode 22e, which is formed of the first n-type polycrystalline silicon layer. Gate electrode 22e is arranged, via gate oxide film, on well region 10 which includes a channel region between source and drain 18d, 18f. Gate electrode 22e functions as the word line WL.

P+ diffusion regions 24a, 24b for well biasing are respectively provided in p-wells 10 which are adjacent to n+ source region 16c, 16d.

A first CVD-SiO2 film 26a covers substrate 12 and gate electrodes 22a, 22b 22e, and functions as a first interlayer insulating layer. A pair of cross interconnections 28a, 28b are arranged on CVD-SiO2 film 26a so as to cut across island-shaped substrate 12 and island-shaped p-well region 10. First cross interconnection 28a is formed of p-type polycrystalline interconnection section 32a, n-type polycrystalline silicon interconnection section 34aand tungsten layer 36a as shown in FIGS. 3 to 5. The p-type polycrystalline interconnection section 32a is connected to p+ drain 18a of Qp11 via contact hole 30a opened in the first CVD-SiO2 film 26a. The n-type polycrystalline silicon interconnection section 34ais respectively connected, via contact hole 30c, 30b opened in the first CVD-SiO2 film 26a, to n+ drain 18c of Qn11 and extension 22b0, extending onto field oxide film 14, of gate electrode 22b which is formed of the first n-type polycrystalline silicon layer. Tungsten layer 36a is put on interconnection sections 32a, 34a.

Second cross interconnection 28b is formed of p-type polycrystalline interconnection section 32b, n-type polycrystalline silicon interconnection section 34b and tungsten layer 36b. The p-type polycrystalline silicon interconnection section 32b is connected to p+ drain 18b of Qp12 via contact hole 30d opened in the first CVD-SiO$_2$ film 26a. The n-type polycrystalline silicon interconnected section 34b is respectively connected, via contact hole 30f, 30e opened in the first CVD-SiO$_2$ film 26a, to n+ drain 18d of Qn12 and extension 22a0, extending onto field oxide film 14, of gate electrode 22a which is formed of the first n-type polycrystalline silicon layer. Tungsten layer 36b is put on interconnection sections 32b, 34b.

By arranging cross interconnections 28a, 28b in this way, gate electrode 22b of transistors Qp12, Qn12, which constitute the second CMOS inverter, is respectively connected, via contact holes 30a, 30b, 30c and cross interconnection 28a, to drains 18a, 18c of transistors Qp11, Qn11, which constitute the first CMOS inverter. Also, gate electrode 22a of transistors Qp11, Qn11, which constitute the first CMOS inverter, are respectively connected, via contact holes 30d, 30e, 30f and cross interconnection 28b, to drains 18b, 18d of transistors Qp12, Qn12, which constitute the second CMOS inverter. In this way, the interconnected CMOS inverters form a flip-flop circuit.

A second CVD-SiO$_2$ film 26b covers the first CVD-SiO$_2$ film 26a and interconnections 28a, 28b, as the second interlayer insulating film. Al interconnections 38a, 38b for supplying VSS power source are arranged on second CVD-SiO$_2$ 26b. Al interconnections 38a, 38b are respectively connected to n+ source 16c, 16d of transistors Qn11, Qn12, and p+ diffusion regions 24a, 24b by way of contact holes 30g, 30h, which are opened extending across first and second CVD-SiO$_2$ films 26a, 26b. Since Al interconnections 38a, 38b each also serve as the interconnection for adjacent memory cells, one interconnection is required for each memory cell. Al interconnections 40a, 40b are arranged on second CVD-SiO$_2$ film 26b as bit lines (BL11, BL12) and are connected to drains 18e, 18f of Qn13, Qn14 as transfer gates, respectively, via contact holes 30i, 30j, which are opened extending across first and second CVD-SiO$_2$ films 26a, 26b. Reference numeral 42 is a protective layer covering the whole structure. The polycrystalline silicon layer is shown by the dotted regions in FIGS. 4 and 5.

As shown in FIGS. 3 to 5, according to this embodiment, p-type polycrystalline silicon interconnection section 32a, which is connected to p+ drain 18a of Qp11 via contact hole 30a in first CVD-SiO$_2$ film 26a, n-type polycrystalline silicon interconnection section 34a, which is respectively connected to n+ drain 18c of Qn11 and to extension 22b0, extending onto field oxide film 14, of gate electrode 22b formed of first n-type polycrystalline silicon layer via contact holes 30c, 30b in the first CVD-SiO$_2$ film 26a, and tungsten layer 36a, which is put on interconnection sections 32a, 34a, are used as first cross interconnection 28a for interconnecting one pair of CMOS interverters. P-type polycrystalline silicon interconnection section 32b, which is connected to p+ drain 18b of Qp12 via contact hole 30d in first CVD-SiO$_2$ film 26a, n-type polycrystalline silicon interconnection section 34b, which is respectively connected to n+ drain 18d of Qn12 and to extension 22b0, extending onto field oxide film 14, of gate electrode 22b formed of first n-type polycrystalline silicon layer via contact holes 30f, 30e in the first CVD-SiO$_2$ film 26a, and tungsten layer 36b, which is put on interconnection sections 32b, 34b, is used as the second interconnection 28b for interconnecting one pair of CMOS inverters.

The result of this is that pn junctions are not formed between first and second cross interconnections 28a, 28b and drains 18a, 18b, 18c, 18d, which have different conductivity types, resulting in excellent contact being obtained. Also, since tungsten layers 36a, 36b are put on both p and n type polycrystalline silicon interconnections sections 32a, 32b, and 34a, 34b, the electrical bad effect of the pn junction formed between the interconnections of different conductivity types can be eliminated. Consequently, it is possible to connect the CMOS inverters using only interconnection 28a, 28b arranged on first CVD-SiO$_2$ film 26a, so that it is unnecessary to provide the Al interconnection for connecting a pair of CMOS inverters on the second interlayer insulating film (second CVD-SiO$_2$ film) as the prior art memory cell shown in FIG. 1. This results in an increase in the space for the Al interconnection on the memory cell, which determines the pitch width of the memory cell. As a result of this, Al interconnections 40a, 40b can be arranged on the second CVD-SiO$_2$ film 26b as the bit lines, together with Al interconnections 38a, 38b for VSS power supply. Being able to form the VSS power supply interconnections 38a, 38b of aluminum means that the source regions 16c, 16d of Qn11, Qn12 and p+ diffusion regions 24a, 24b for biasing adjacent p-well 10 can be simultaneously ohmically connected via contact holes 30g, 30h with interconnections 38a, 38b, respectively as shown in FIG. 3. In other words, Al interconnection 38a, 38b for VSS power supply can also be used for well-biasing so that it is possible to provide well-biasing for each memory cell. Accordingly, because it is possible to increase biasing point for p-well 10 and to effectively reduce the resistance of this well, it is possible to drastically increase the resistance to latch up.

Also, because it is not necessary to provide the Al interconnection for well biasing in a separate area of the memory cell for every eight cells, for example, as is shown in the prior art structure of FIG. 1, the area of the memory cells themselves can be reduced.

There are two Al interconnections 40a, 40b as bit lines and one Al interconnection 38a (or 38b) for VSS power supply, e.g. in total 3 interconnections, on the second CVD-SiO$_2$, film 26b, which is one Al interconnection less than the prior art memory cell, which allows the pitch of the memory cells to be reduced. If the practical design rule of allowing 1.5 μm per interconnection is followed, the memory cell of this invention, as shown in FIG. 3, have a pitch of 15.5 μm compared to 17 μm of the prior art.

In the above embodiment, tungsten is used for the metal layer put on the p- and n-type polycrystalline silicon interconnection sections. However, a metal having a high metal point may be chosen from the group of molybdenum, tantalum, titanium or platinum, etc. instead. Also, the metal layer may be provided underneath the p- and n-type polycrystalline silicon interconnection sections.

Figure 6:
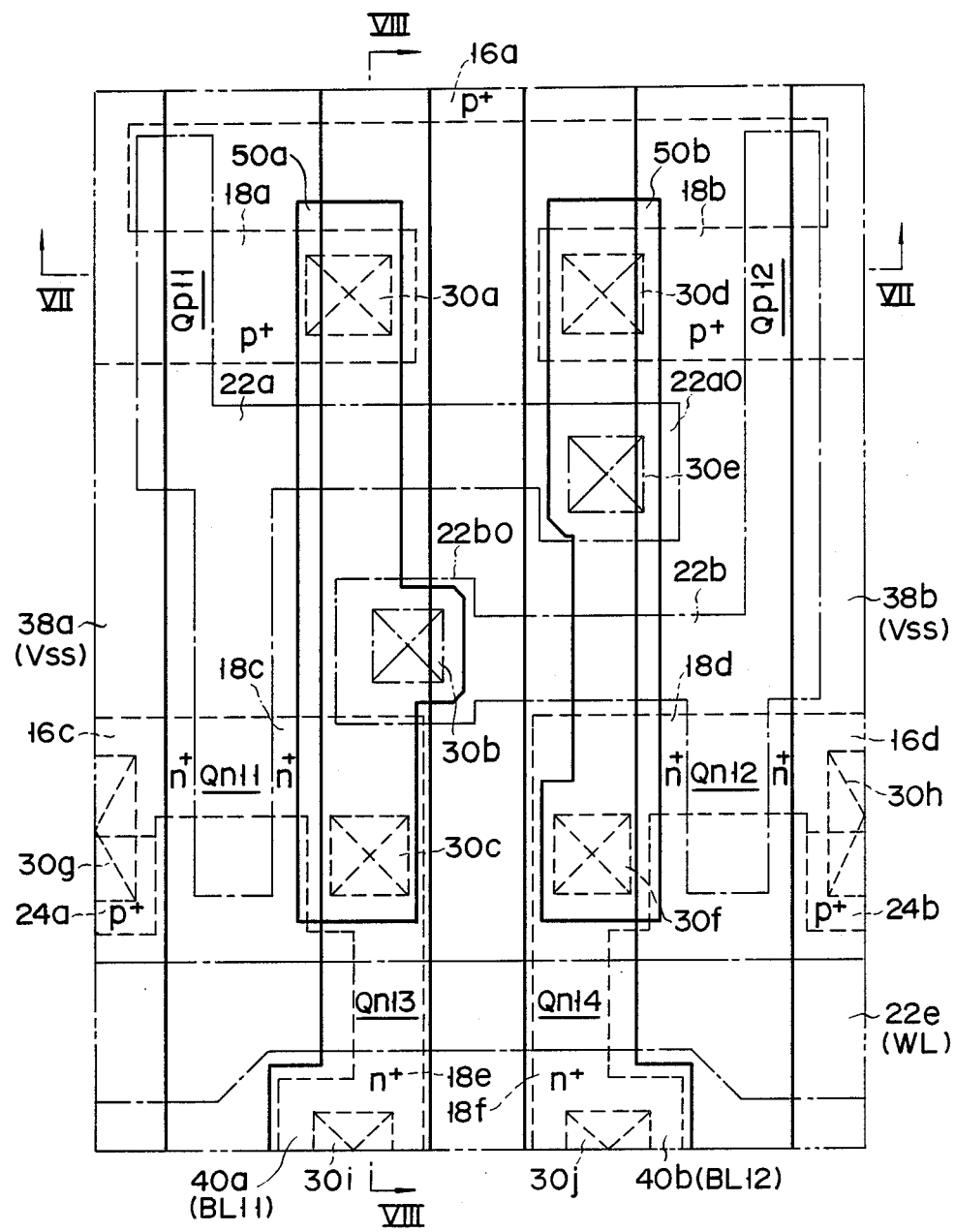
FIG. 6 is a plan view of a second embodiment of this invention.
Figure 7:
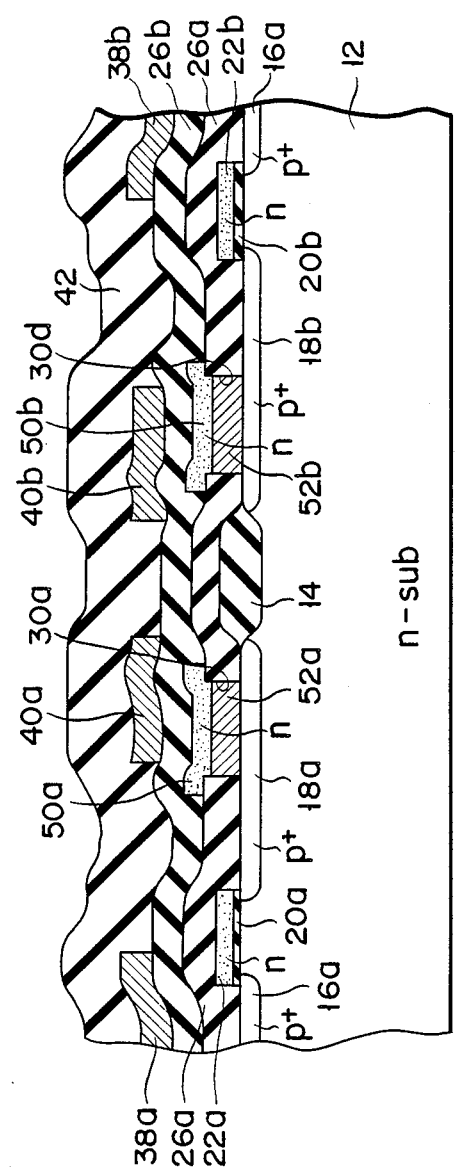
FIG. 7 is a cross-sectional view taken along line VII—VII of FIG. 6.
Figure 8:
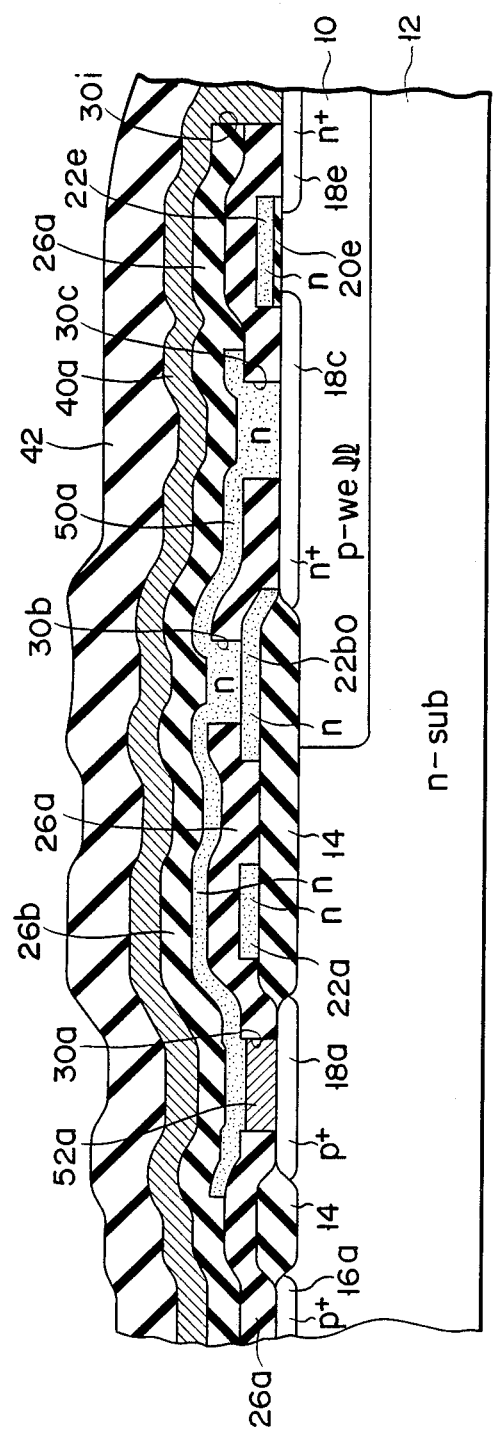
FIG. 8 is a cross-sectional view taken along line VIII—VIII of FIG. 6.

The following is a description, in conjunction with FIGS. 6 to 8, of the semiconductor memory device according to a second embodiment of this invention.

Qp11, Qn11 are p- and n-channel MOS transistors which form a first CMOS inverter, and Qp12, Qn12 form a second CMOS inverter. The common gate of one CMOS inverter is interconnected to the common drain section of the other CMOS inverter to form a flip-flop circuit. Qn13, Qn14 are n-channel MOS transistors connected to the drains of Qn11, Qn12 as transfer gates.

Figure 9:
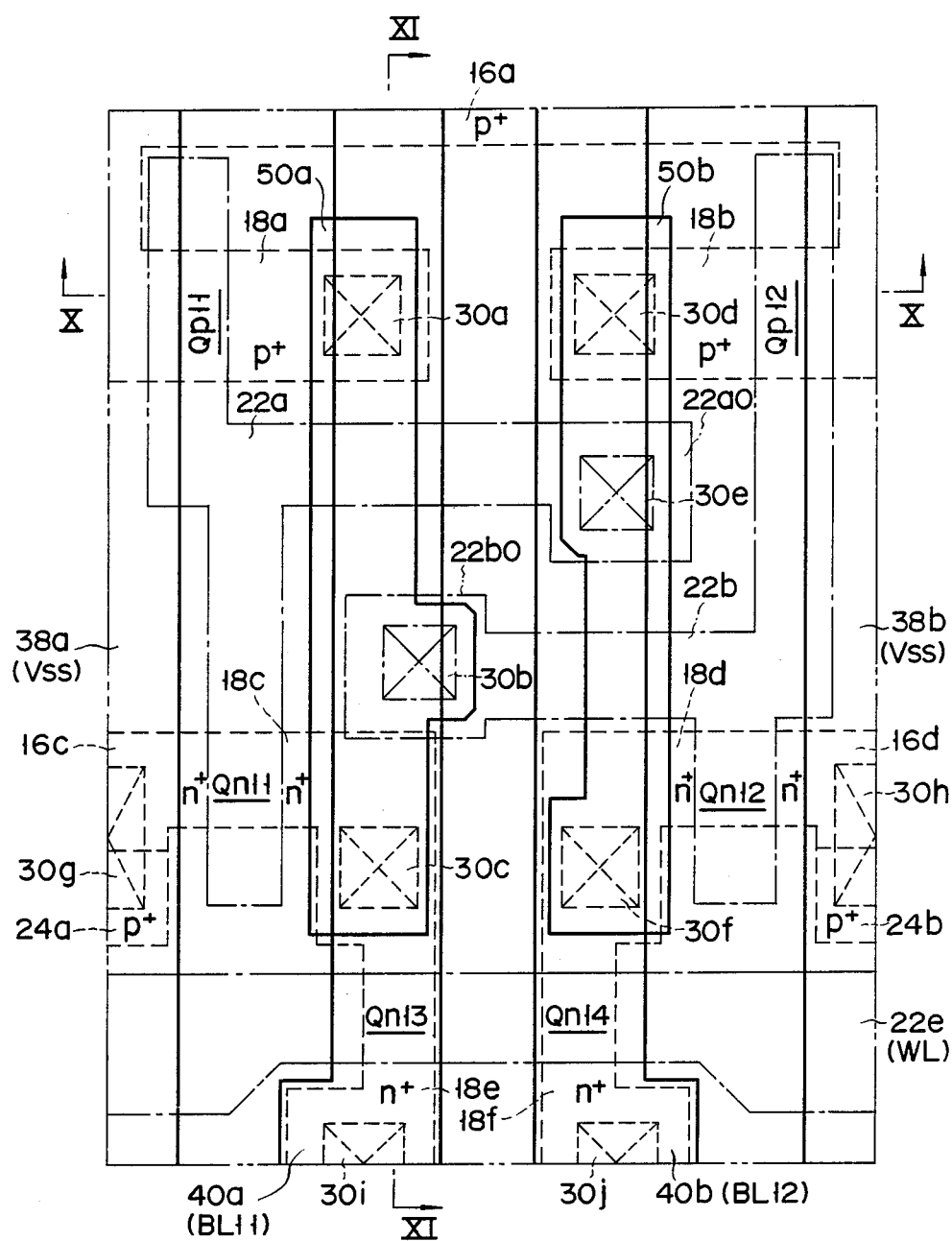
FIG. 9 is a plan view of a third embodiment of this invention.

As shown in FIGS. 7 and 9, Qp11 and Qp12 are each formed in islands in an n-type silicon substrate 12, which is isolated by field oxide film 14 in substrate 12 in which a p-well 10 is selectively formed. Qp11 is formed of p+ type source 16a and drain region 18a formed electrically separated in the island, and gate electrode 22a, which is formed of a first n-type polycrystalline silicon layer doped with phosphorus, for example, in common with the gate of Qn11. Gate electrode 22a is arranged, via gate oxide film 20a, on substrate 12 which includes a channel region between source and drain 16a, 18a. The other transistor Qp12 is formed of p+ type source 16a and drain region 18b formed electrically isolated in the island in silicon substrate 12, and gate electrode 22b, which is formed of the first n-type polycrystalline silicon layer doped with phosphorus, for example, in common with the gate of Qn12. Gate electrode 22b is arranged, via gate oxide film 20b, on substrate 12 which includes a channel region between source and drain 16a, 18b. P+ source region 16a is shared by both Qp11 and Qp12 and functions as the VDD line.

Qn11, Qn12 are formed in the island-shaped p-well region 10, which is isolated by field oxide film 14. Qn11 is formed of n+ type source 16c and drain region 18c formed electrically isolated in the island-shaped p-well region 10, and gate electrode 22a, which is formed of the first n-type polycrystalline silicon layer. Gate electrode 22a is arranged, via gate oxide film (not shown), on p-well region 10 which includes a channel region between source and drain 16c, 18c. Qn12 is formed of n+ type source 16d and drain region 18d formed electrically isolated in the island-shaped p-well region 10, and gate electrode 20b, which is formed of the first n-type polycrystalline silicon layer. Gate electrode 20b is arranged, via gate oxide film (not shown), on p-well region 10 which includes a channel region between source and drain 16d, 18d.

Qn13, which functions as a transfer gate, is formed of n+ type source region common with drain region 18c and drain region 18e formed electrically isolated in the island-shaped well region 10, and gate electrode 22e, which is formed of the first n-type polycrystalline silicon layer doped with phosphorus, for example, and is common to Qn14, as shown in FIG. 8. Gate electrode 22e is arranged, via gate oxide film 20e, on well region 10 which includes a channel region between source and drain 18c, 18e. Qn14 is formed of n+ type source region common with drain region 18d and drain regin 18f formed electrically isolated in the island-shaped well region 10, and gate electrode 22e, which is formed of the first n-type polycrystalline silicon layer. Gate electrode 22e is arranged, via gate oxide film, on well region 10 which includes a channel region between source and drain 18d, 18f. Gate electrode 22e functions as the word line WL.

P+ diffusion regions 24a, 24b for well biasing are respectively provided in p-wells 10 which are adjacent to n+ source regions 16c, 16d.

A first CVD-SiO2 film 26a covers substrate 12 and gate electrodes 22a, 22b 22e, and the functions as a first interlayer insulating layer. A pair of cross interconnections 50a, 50b, which are formed of a second n-type polycrystalline silicon layer doped with impurities, such as phosphorus, to provide conductivity, are arranged on CVD-SiO2 film 26a so as to cut across island-shaped substrate 12 and island-shaped p-well 10.

First cross interconnection 50a is connected to p+ drain 18a of Qp11 via contact hole 30a, which is opened in first CVD-SiO2 film 26a and filled with a metal 52a such as tungsten, as shown in FIGS. 7 and 8. Interconnection 50a is also respectively connected, via contact holes 30c, 30b in the first CVD-SiO2 layer 26a, to n+ drain 18c of Qn11 and to extension 22b0, which extends onto field oxide film 14, of gate electrode 22b formed of the first n-type polycrystalline silicon layer.

Second cross interconnection 50b is connected to p+ drain 18b of Qp12 via contact hole 30d, which is opened in first CVD-SiO2 film 26a and filled with a metal such as tungsten 52b. Interconnection 50b is also respectively connected, via contact holes 30f, 30e in first VCD-SiO2 layer 26a, to n+ drain 18d of Qn12 and to extension 22a0, which extends onto field oxide film 14, of gate electrodes 22a formed of the first n-type polycrystalline silicon layer.

The gate electrode 22b of transistors Qp12, Qn12, which form the second CMOS inverter, is intersectingly connected to the drains 18a, 18c of transistors Qp11, Qn11, which form the first CMOS inverter, via interconnection 50a and contact holes 30b, 30c, and contact hole 30a which is filled with tungsten 52a. Also, the gate electrode 22a of transistors Qp11, Qn11, which form the first CMOS inverter, is connected to the drains 18b, 18d of transistors Qp12, Qn12, which form the second CMOS inverter, via interconnection 50b and contact holes 30e, 30f, and contact hole 30d which is filled with tungsten 52b. In this way, by providing cross interconnections 50a, 50b, which are formed of the second n-type polycrystalline silicone layer, it is possible to form a flip-flop circuit in which the CMOS inverters are interconnected.

A second CVD-SiO2 film 26b covers the first VCD-SiO2 film 26a and interconnections 50a, 50b, as the second interlayer insulating film. Al interconnections 38a, 38b for supplying VSS power soruce are arranged on second VCD-SiO2 26b. Al interconnections 38a, 38b are respectively connected to a n+ source 16c, 16d of transistors Qn11, Qn12, and p+ diffusion regions 24a, 24b by way of contact holes 30g, 30h, which are opened extending across first and second CVD-SiO2 films 26a, 26b. Since Al interconnections 38a, 38b each serve as the interconnection for adjacent memory cells, one interconnection is required for each memory cell. Al interconnections 40a, 40b are arranged on second CVD-SiO2 film 26b as bit lines (BL11, BL12) and are connected to drains 18e, 18f of Qn13, Qn14 as transfer gates, respectively, via contact holes 30i, 30j, which are opened extending across first and second CVD-SiO2 ilms 26a, 26b. Reference numeral 42 is a protective layer covering the whole structure.

As shown in FIGS. 6 to 8, according to this embodiment, interconnection 50a intersectingly connects gate electrode 22a of the first CMOS inverter with the p+ and n+ drains 18b, 18d of transistors Qp12, Qn12 of the second CMOS inverter, and interconnections 50b intersectingly connects gate 22b of the second CMOS inverter with the p+ and n+ rains 18a, 18c of Qp11, Qn11 of the first CMOS inverter. Both interconnections 50a, 50b are formed of the second n-type polycrystalline silicon layer, which is doped with a conductivity-providing impurity such as phosphorus, on first CVD-SiO2 film 26a. Also, tungsten 52a, 52b is provided in contact holes 30a, 30d formed in first CVD-SiO2 film 26a, in order to connect interconnections 50a, 50b with p+ drains 18a, 18b of the opposite conductivity to the impurities (n-type phosphorus) in interconnections 50a, 50b, respectively. As the result, pn junctions are not formed between interconnections 50a, 50b and the p+ drains 18a, 18b, resulting in good contact being made.

The connections between cross interconnections 50a, 50b formed of the second n-type polycrystalline silicon layer and extensions 22a0, 22b0 of gate electrodes 22a, 22b formed of the first n-type polycrystalline silicon layer, and between cross interconnections, 50a, 50b and n+ drains 18c, 18d of n-channel MOS transistors Qn11, Qn12, both is the connections which include impurities of the same conductivity (n type), so that good ohmic contact can be obtained.

Consequently, the intersecting connection of the CMOS inverters can be made with only interconnections 50a, 50b, so that it is unnecessary to provide the Al interconnection for connecting a pair of CMOS inverters on the second interlayer insulation film (second CVD-SiO$_2$), as in the prior art memory cell shown in FIG. 1. This, therefore, results in an increase in the Al interconnection space on the memory cell, which determines the pitch width of the cells. Consequently, Al interconnections 40a, 40b as the bit lines, as well as Al interconnections 38a, 38b for VSS power supply can be placed on second CVD-SiO$_2$ film 26b.

Because interconnections 38a, 38b for VSS power supply can be formed of aluminum in this way, it is possible to achieve good connections between interconnections 38a, 38b and sources 16c, 16d of Qn11, Qn12, and between interconnections 38a, 38b and p+ diffusion regions 24a, 24b for biasing p-well 10, which is adjacent to source regions 16c, 16d, as shown in FIG. 6. In other words, because Al interconnections 38a, 38b for VSS power supply can also be used for well biasing, it is possible to bias the wells of each memory cell. Accordingly, biasing points can be increased for p-well 10, thereby reducing the effective resistance of the well and improving the latch up resistance.

Also, because the well-biasing Al interconnection provided for every 8, cells, for example, in the prior art structure shown in FIG. 1 need not be placed in a special area of the memory cell, the area of the memory cell itself can be reduced.

There are two Al interconnections 40a, 40b as bit lines and one Al interconnection 38a (or 38b) for VSS power supply, e.g. in total 3 interconnections, on the second CVD-SiO$_2$ film 26b, which is one Al interconnection less than the prior art memory cell, which allows the pitch of the memory cells to be reduced. If the practical design rule of allowing 1.5 μm per interconnection is followed, the memory cell of this invention, as shown in FIG. 6, have a pitch of 15.5 μm compared to 17 μm of the prior art.

In the above embodiment, tungsten is used for the metal layer filled into the contact holes. However, a metal having a high metal point may be chosen from the group of molybdenum, tantalum, titanium or platinum, etc. instead. Also, in the above embodiment, n-type impurities are doped to form cross interconnections of the second polycrystalline silicon layer. However, p-type polycrystalline silicon doped with p-type impurities such as boron is also acceptable. In this case, if the gate electrode is formed of the first n-typepolycrystalline silicon layer, metal must be filled into at least the contact holes that connect the interconnection formed of the second p-type polycrystalline silicon layer with the extension of the gate electrode formed of the first n-type polycrystalline silicon layer and the n+ drain regions.

Figure 10:
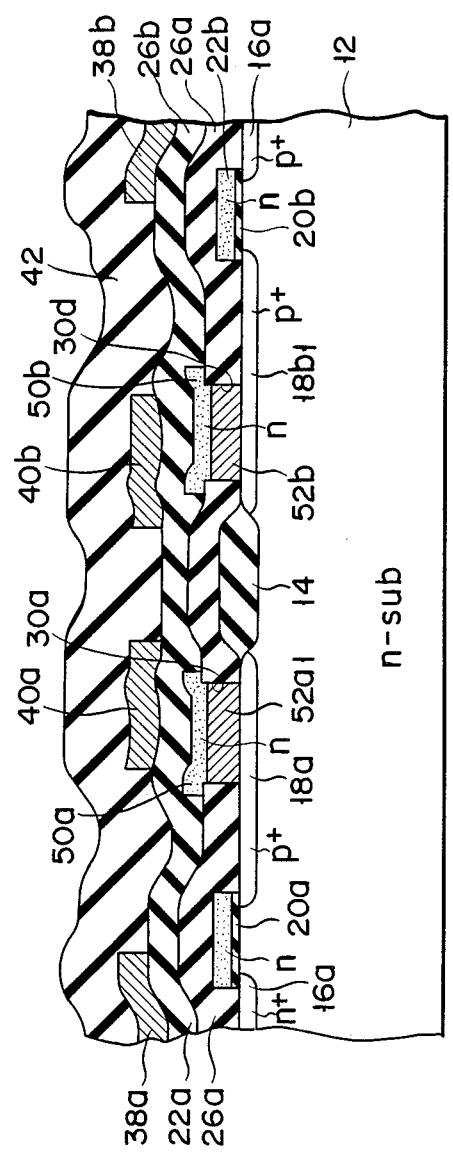
FIG. 10 is a cross-sectional view taken along line X—X of FIG. 9.
Figure 11:
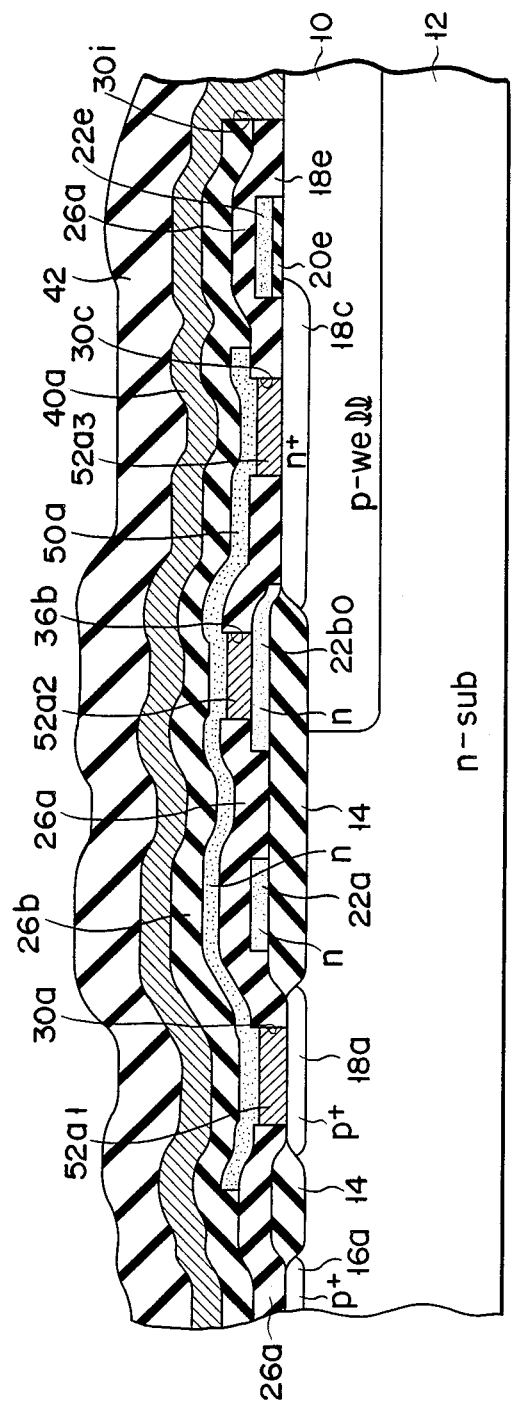
FIG. 11 is a cross-sectional view taken along line XI—XI of FIG. 9.

The following is a description, in conjunction with FIGS. 9 to 11, of the semiconductor device according to the third embodiment of the invention.

In the drawings, Qp11, Qn11 are the p and n channel MOS transistors that form a first CMOS inverters, and Qp112, Qn12 form a second CMOS inverter. The common gate of the one CMOS inverter is cross connected to the common drain section of the other CMOS inverter to form a flip-flop circuit. Qn13, Qn14 are n channel MOS transistors connected to the drains of MOS transistors Qn11, Qn12, and function as transfer gates.

As shown in FIGS. 10 and 11, Qp11 and Qp12 are each formed in islands in an n-type silicon substrate 12 isolated by field oxide film 14. A p-well 10 is selectively formed in substrate 12. Qp11 is formed of p+ type source 16a and drain region 18a formed electrically separated in the island, and gate electrode 22a, which is formed of a first n-type polycrystalline silicon layer doped with phosphorus, for example, in common with the gate of Qn11. Gate electrode 22a is arranged, via gate oxide film 20a, on substrate 12 which includes a channel region between source and drain 16a, 18a. The other transistor Qp12 is formed of p+ type source 16a and drain region 18b formed electrically isolated in the island in silicon substrate 12, and gate electrode 22b, which is formed of the first n-type polycrystalline silicon layer doped with phosphorus, for example, in common with the gate of Qn12. Gate electrode 22b is arranged, via gate oxide film 20b, on substrate 12 which includes a channel region between source and drain 16a, 18b. P+ source region 16a is shared by both Qp11 and Qp12 and functions as the VDD line.

Qn11, Qn12 are formed in the island-shaped p-well region 10, which is isolated by field oxide film 14. Qn11 is formed of n+ type source 16c and drain region 18c, which are formed electrically isolated in the island-shaped p-well 10, and gate electrode 22a, which is formed of the first n-type polycrystalline silicon layer. Gate electrode 22a is arranged, via gate oxide film (not shown), on p-well 10 which includes a channel region between source and drain 16c, 18c. The other transistor Qn12 is formed of n+ type source 16d and drain region 18d which are formed electrically isolated in the island-shaped p-well 10, and gate electrode 20b, which is formed of the first n-type polycrystalline silicon layer. Gate electrode 20b is arranged, via gate oxide film (not shown), a p-well 10 which includes a channel region between source and drain 16d, 18d.

Qn13, which functions as a transfer gate, is formed of n+ type source region common with drain region 18c and drain region 18e which are formed electrically isolated in the island-shaped well region 10, and gate electrode 22e, which is formed of the first n-type polycrystalline silicon layer doped with phosphorus, for example, and is common to Qn14 as shown in FIG. 11. Gate electrode 22e is arranged, via gate oxide film 20e on well region 10 which includes a channel region between source and drain 18c, 18e. Qn14 is formed of n+ type source region common with drain region 18d and drain region 18f formed which are electrically isolated in the island-shaped well region 10, and gate electrode 22e, which is formed of the first n-type polycrystalline silicon layer. Gate electrode 22e is arranged, via gate oxide film, on well region 10 which includes a channel region between source and drain 18d, 18f. Gate electrode 22e functions as the word line WL.

P+ diffusion regions 24a, 24b for well biasing are respectively provided in p-wells 10 which are adjacent to n+ source regions 16c, 16d.

A first CVD-SiO$_2$ film 26a covers substrate 12 and gate electrodes 22a, 22b 22e, and functions as a first interlayer insulating layer. A pair of cross interconnections 50a, 50b, which are formed of a second n-type polycrystalline silicon layer doped with an impurity, such as phosphorus, to provide conductivities, are arranged on CVD-SiO$_2$ film 26a so as to cut across island-shaped substrate 12 and island-shaped p-well 10. As shown in FIGS. 10 and 11, first cross interconnection 50a is connected, via contact holes 30a, 30c, 30b, which are opened in the first CVD-SiO$_2$ film 26a and filled with a high melting point metal such as tungsten 52a1, 52a3, 52a2, to p+ drain 18a of Qp11, n+ drain 18c of Qnn and extension 22b0, extending onto field oxide film 14, of gate electrode 22b, which is formed of first n-type polycrystalline silicon layer.

Second cross interconnection 50b is connected, via contact holes 30d, 30f, 30e, which are opened in the first CVD-SiO$_2$ film 26a and filled with a high melting point metal such as tungsten 52b1, 52b3, 52b2 (tungsten 52b2, 52b3 of contact holes 30e, 30f is not shown), to p+ drain 18b of Qp12, n+ drain 18d of Qn12 and extension 22a0, extending onto field oxide film 14, of gate electrode 22a, which is formed of the first n-type polycrystalline silicon layer.

By providing these cross interconnections 50a, 50b, gate electrode 22b of Qp12, Qn12, which form the second CMOS inverter, is intersectingly connected to drains 18a, 18c of Qp11, Qn11, which form the first CMOS inverter, through cross interconnection 50a and tungsten 52a1, 52a2, 52a3 filled contact holes 30a, 30b, 30c. Gate electrode 22a of Qp11, Qn11, which form the first CMOS inverter, is intersectingly connected to drains 18b, 18d of Qp12, Qn12, which form the second CMOS inverter, through cross interconnection 50b and tungsten 52b1, 52b2, 52b3 filled in contact holes 30d, 30e, 30f (tungsten 52b2, 52b3 of contact holes 30e, 30f is not shown). With this construction, a flip-flop circuit in which the CMOS inverters are mutually interconnected is achieved.

A second CVD-SiO$_2$ film 26b covers the first VCD-SiO$_2$ film 26a and interconnections 50a, 50b, as the second interlayer insulating film. Al interconnections 38a, 38b for supplying VSS power source are arranged on second CVD-SiO$_2$ 26b. Al interconnections 38a, 38b are respectively connected to n+ source 16c, 16d of transistor Qn11, Qn12, and p+ diffusion regions 24a, 24b by way of contact holes 30g, 30h, which are opened extending across first and second CVD-SiO$_2$ films 26a, 26b. Since Al interconnections 38a, 38b each serve as the interconnection for adjacent memory cells, one interconnection is required for each memory cell.

Al interconnections 40a, 40b are arranged on second CVD-SiO$_2$ film 26b as bit lines (BL11, BL12) and are connected to drains 18e, 18f of Qn13, Qn14 as transfer gates, respectively, via contact holes 30i, 30j, which are opened extending across first and second CVD-SiO$_2$ films 26a, 26b. Reference numeral 42 is a protective layer covering the whole structure.

As shown in FIGS. 9 to 11, with this memory cell, gate electrode 22a of the first CMOS inverter is connected to the p+, n+ drains 18b, 18d of transistors Qp12, Qn12 of the the second CMOS inverter, and gate electrode 22b of the second CMOS inverter is connected to p+ n+ drains 18a and 18c of Qp11, Qn11 of the first CMOS inverter by intersecting interconnections 50a, 50b. Interconnections 50a, 50b is formed of the second n-type polycrystalline silicon layer doped with an impurity such as phoshorus which provides conductivity and provided on the first CVD-SiO$_2$ film 26a. Also, tungsten 52a1, 52a2 is respectively provided in contact holes 30a, 30d formed in the first CVD-SiO$_2$ film 26a, in order to connect interconnection 50a, 50b with p+ drains 18a, 18b, which has an opposite conductivity to the impurity in interconnection 50a, 50b (n type phosphorus). Therefore, it is possible to obtain good contact without forming a pn junction between interconnections 50a, 50b formed of the second n type polycrystalline silicon layer and p+ drains 18a, 18b.

Also, since the connections between interconnects 50a, 50b and extensions 22a0, 22b0 of gate electrodes 22a, 22b and between interconnects 50a, 50b and n+ drains 18c, 18d of Qn11, Qn12 are made through tungsten 52a2, 52a3, 52b2, 52b3, a similar good ohmic connection is possible. However, these connections have the same conductivity impurities (n type) so that a good ohmic contact is possible even if it is not made through the tungsten.

Consequently, it is possible to interconnect the CMOS inverters with interconnections 50a, 50b alone, so that it is unnecessary to provide the Al interconnection for connecting a pair of CMOS inverters on the second interlayer insulation film (second CVD-SiO$_2$), as in the prior art memory cell shown in FIG. 1. This, therefore, results in an increase in the Al interconnection space on the memory cell, which determines the pitch width of the cells. Consequently, Al interconnections 40a, 40b as the bit lines, as well as Al interconnections 38a, 38b for VSS power supply can be placed on second CVD-SiO$_2$ film 26b.

Because interconnections 38a, 38b for VSS power supply can be formed of aluminum in this way, it is possible to form good connections between interconnections 38a, 38b and sources 16c, 16d of Qn11, Qn12, and between interconnections 38a, 38b and p+ diffusion regions 24a, 24b for biasing p-well 10, which is adjacent to source regions 16c, 16d, as is shown in FIG. 9. In other words, because Al interconnections 38a, 38b for VSS power supply can also be used for well biasing, it is possible to bias the wells of each memory cell. Accordingly, biasing points can be increased for p-well 10, thereby reducing the effective resistance of the well and improving the latch up resistance.

Also, because the well-biasing Al interconnection provided in the prior art structure shown in FIG. 1 need not be placed in a special area of, for example, every eight memory cells, the area of the memory cell itself can be reduced.

There are two Al interconnections 40a, 40b as bit lines and one Al interconnection 38a (or 38b) for VSS power supply, e.g. in total 3 interconnections, on the second CVD-SiO$_2$ film 26b, which is one Al interconnection less than the prior art memory cell, which allows the pitch of the memory cells to be reduced. If the practical design rule of allowing 1.5 $\mu$m per interconnection is followed, the memory cell of this invention has a pitch of 15.5 $\mu$m compared to 17 $\mu$m of the prior art.

According to this invention, means is basically provided for providing ohmic contact between the p+ and n+ diffusion regions in complementary semiconductor device. Accordingly, this invention can be expanded as described below in the fourth embodiment of this invention, as shown in FIG. 12.

P-well 110 is selectively provided in the surface of n-type silicon substrate 112. Field oxide film 114 is selectively provided in substrate 112 to isolate substrate 112 and p-well 110 into islands. N+ diffusion region 118a (for example, a drain region) is selectively provided in p-well 110 and p+ diffusion region 118b (for example, a drain region) is selectively provided in substrate 112. First CVD-SiO$_2$ film 126a covers the entire surface including field oxide film 114 as the first interlayer insulation film. Contact holes 130a, 130b are formed in locations of CVD-SiO$_2$ film 126a corresponding to a part of diffusion regions 118a, 118b.

Interconnection 128 is provided on this CVD-SiO$_2$ film 126a. Interconnection 128 comprises n-type polycrystalline silicon interconnection section 134 connected to n+ diffusion region 118a via contact hole 130a, p-type polycrystalline silicon interconnection section 32 connected to p+ diffusion region 118b via contact hole 130b, and tungsten layer 136 as the high melting point metal layer put on a region that includes at least the boundary of n and p polycrystalline silicon interconnection sections 134, 132. Second CVD-SiO$_2$ film 126b covers the whole surface including interconnection 128 as the second interlayer insulation film.

With this kind of structure, it is possible to obtain good ohmic contact without forming a pn junction within interconnection 128. Accordingly, an additional metal interconnection in a prior art need not be provided on the second CVD-SiO$_2$ film, which allows tighter patterning on the film, as well as increasing the freedom with which the metal interconnection is arranged. This, correspondingly, makes it possible to obtain a highly integrated complementary semiconductor device.

The following is a description with reference to FIG. 13 of a fifth embodiment of this invention.

P-well 110 is selectively provided in the surface of n-type silicon substrate 112. Field oxide film 114 is selectively provided to isolate substrate 112 and p-well 110 into islands. N+ diffusion region 118a (for example, a drain region) is selectively provided in p-well 110 and p+ diffusion region 118b (for example, a drain region) is selectively provided in substrate 112. First CVD-SiO$_2$ film 126a covers the entire surface including field oxide film 114 as the first interlayer insulation film. Contact holes 130a, 130b are formed in locations of CVD-SiO$_2$ film 126a corresponding to a part of dispersion regions 118a, 118b.

Polycrystalline silicon interconnection 150 of one conductivity type, n for example, is provided on this CVD-SiO$_2$ film 126a. Interconnection 150 is connected to n+ and p+ diffusion regions 118a, 118b sandwiching the high melting point metal, such as tungsten 152a, 152b, which buried in contact holes 130a, 130b, respectively. Second CVD-SiO$_2$ film 126b covers the whole surface including n-type polycrystalline silicon interconnection 150 as the second interlayer insulation film.

By connecting interconnection 150 to n+ and p+ diffusion regions 118a, 118b through tungsten 152a, 152b buried in contact holes 130a, 130b, it is possible to obtain good ohmic contact without forming a pn junction between interconnection 150 and diffusion region 118b which have different conductivities. Accordingly, a separate metal interconnection in a prior art need not be provided on the second CVD-SiO$_2$ film, which allows tighter patterning on the film, as well as increasing the freedom with which the metal interconnection is arranged. This, correspondingly, makes it possible to obtain a highly integrated complementary semiconductor device.

This invention is not limited to buring a high melting point metal, such as tungsten, in the contact holes on the n+ and p+ diffusion regions, as shown in FIG. 13. For example, when an n-type polycrystalline silicon interconnection 150, as shown in FIG. 14, is used, only contact hole 130b on p+ diffusion region 118b need be filled with high melting point metal 152b. Also, as shown in FIG. 15, it is possible to form a high melting point metal pattern 162 (of tungsten for example) on first CVD-SiO$_2$ 126a to connect n+ and p+ diffusion regions 118a, 118b through contact holes 130a, 130b, and to provide an n-type polycrystalline silicon interconnection on top of this.

What is claimed is:

1. A semiconductor device with six-transistor memory cells provided in matrix form, each said memory cell comprising:
   a first-channel type first MOS transistor having a source, drain, gate and substrate region;
   a second-channel type second MOS transistor having a source, drain, gate and substrate region, the gates of said first and second MOS transistors being formed of a first portion of a first polycrystalline silicon layer which includes impurities for providing conductivity, and said first and second MOS transistors being electrically connected to form a first CMOS inverter;
   a first-channel type third MOS transistor having a source, drain, gate and substrate region;
   a second-channel type fourth MOS transistor having a source, drain, gate and substrate region, the gates of said third and fourth MOS transistors being formed of a second portion of the first polycrystalline silicon layer which includes impurities for providing conductivity, and said third and fourth MOS transistors being electrically connected to form a second CMOS inverter;
   a second-channel type fifth MOS transistor for data transfer having a source, drain, gate and substrate region, the source of said fifth MOS transistor being connected to the drain of said second MOS transistor;
   a second-channel type sixth MOS transistor for data transfer having a source, drain, gate and substrate region, the source of said sixth MOS transistor being connected to the drain of said fourth MOS transistor, and the gates of said fifth and sixth MOS transistors being connected to a word line;
   first potential supplying means coupled to the sources of said first and third MOS transistors for supplying a first potential to the sources of said first and third MOS transistors;
   second potential supplying means for supplying a second potential to the sources of said second and fourth MOS transistors;
   first connection means for connecting the gate of said first MOS transistor, the drain of said third MOS transistor, and the drain of said fourth MOS transistor via first contact holes, said first connection means including
      an impurity-doped first portion of a second polycrystalline silicon layer a first high-melting point metal layer and being formed on a first interlayer insulation film which is formed on the first and second portions of the first polycrystalline silicon layer, said first high-melting point layer being arranged to decrease the resistance value of said impurity-doped first portion of second polycrystalline silicon layer;

second connection means for connecting the gate of said third MOS transistor, the drain of said first MOS transistor, and the drain of said second MOS transistor via second contact holes, said second connection means including an impurity-doped second portion of said second polycrystalline silicon layer, and a second high-melting point metal layer being formed on said first interlayer insulation film, said second high-melting point layer being arranged to decrease the resistance value of said impurity-doped second portion of second polycrystalline silicon layer;

a second interlayer insulation film formed on said first and second connection means;

a first metal interconnection layer provided on said second interlayer insulation film for connecting said second potential supply means to the source and the substrate region of said second MOS transistor via a third contact hole provided in said second interlayer insulation film;

a second metal interconnection layer provided on said second interlayer insulation film for connecting said second potential supplying means to the source and said substrate region of said fourth MOS transistor via a fourth contact hole provided in the second interlayer insulation film, said first and second metal interconnection layers being shared by adjacent memory cells;

a third metal interconnection layer, provided on said second interlayer insulation film and connected to the drain of said fifth MOS transistor via a fifth contact hole formed in said second interlayer insulation film, for functioning as a first bit line; and a fourth metal interconnection layer, provided on said second interlayer insulation film and connected to the drain of said sixth MOS transistor via sixth contact hole formed in said second interlayer insulation film, for functioning as a second bit line.

2. The semiconductor device according to claim 1, wherein said first and second high-melting point metal layers are chosen from a group of tungsten, molybdenum, tantalum, titanium and platinum.

3. The semiconductor device according to claim 1, wherein the substrate region of said second MOS transistor is connected to said first metal interconnection layer, and the substrate region of said fourth MOS transistor is connected to said second metal interconnection layer.

4. The semiconductor device according to claim 1, wherein said first connection means includes:

a first member of said first portion of said second polycrystalline silicon layer, which includes a second conductivity type impurity, for connecting the gate of said first MOS transistor and the second conductivity type drain of said fourth MOS transistor via one of said first contact holes, a second member of said first portion of the second polycrystalline silicon layer, which includes a first conductivity type impurity, for connecting said first member of said first portion of said second polycrystalline silicon layer and the first-conductivity type drain of said third MOS transistor via one of said first contact holes, wherein said first high-melting point metal layer is formed on said first and second members of said first portion of said second polycrystalline silicon layer;

wherein said second connecting means includes a first member of said second portion of the second polycrystalline silicon layer, which includes a second conductivity type impurity, for connecting the gate of said third MOS transistor and the second conductivity type drain of said second MOS transistor via one of said second contact holes;

a second member of said second portion of the second polycrystalline silicon layer, which includes a first conductivity type impurity, for connecting said first member of said second portion of said second polycrystalline silicon layer and the first-conductivity type drain of said first MOS transistor via one of said second contact holes, and wherein said second high-melting point metal layer is formed on said first and second members of said second portion of said second polycrystalline silicon layer.

5. The semiconductor memory device according to claim 4, wherein said first and second high-melting point metal layers are chosen from a group of tungsten, molybdenum, tantalum, titanium and platinum.

6. The semiconductor memory device according to claim 4, wherein the substrate region of said second MOS transistor is connected to said first metal interconnection layer, and the substrate region of said first MOS transistor is connected to said second metal interconnection layer.

7. The semiconductor device according to claim 1, wherein in said first connection means said first portion of said second polycrystalline silicon layer has an impurity of one type of conductivity; and said first high-melting point metal layer is provided within one of said first contact holes which is formed on one of the drains of said third and fourth MOS transistors having a conductivity of a type opposite to the conductivity type of said impurity in said first portion of said second polycrystalline layer, said first high-melting point layer being ohmically coupled with said first portion of the second polycrystalline silicon layer and said one of said drains of said third and fourth MOS transistors; and wherein said second connection means said second portion of said second polycrystalline silicon layer has an impurity of one type of conductivity; and said second high-melting point metal layer is provided within one of said second contact holes which is formed on one of the drains of said first and second MOS transistors having a conductivity of a type opposite to the conductivity type of said impurity in said second portion of said second polycrystalline layer, said second high-melting point layer being ohmically coupled with said second portion of the second polycrystalline silicon layer and said one of said drains of said first and second MOS transistors.

8. The semiconductor memory device according to claim 7, wherein the impurity in said first and second portions of the first polycrystalline silicon layer is of the same conductivity type as the impurity in said first and second portions of the second polycrystalline silicon layer.

9. The semiconductor memory device according to claim 8, wherein the impurity in said first and second portions of the first polycrystalline silicon layer and the second polycrystalline silicon layer is n type.

10. The semiconductor memory device according to claim 7, wherein said first and second high-melting point metal layers are chosen from a group of tungsten, molybdenum, tantalum, titanium and platinum.

11. The semiconductor device according to claim 7, wherein the substrate region of said second MOS transistor is connected to said first metal interconnection layer, and the substrate region of said fourth MOS transistor is connected to said second metal interconnection layer.

12. The semiconductor memory device according to claim 1, wherein in said first connection means
said first high-melting point metal layer is provided within each of said first contact holes for connecting said first portion of said second polycrystalline silicon layer to the gate of said first MOS transistor, the drain of said third MOS transistor, and the drain of said fourth MOS transistor, said first high-melting point metal layer also being ohmically coupled with the first portion of the second polycrystalline layer and with the gate of said first MOS transistor, the drain of said third MOS transistor, and the drain of said fourth MOS transistor; and
wherein in said second connection means
said second high-melting point metal layer is provided within each of said second contact holes for connecting said second portion of said second polycrystalline silicon layer to the gate of said third MOS transistor, the drain of said first MOS transistor, and the drain of said second MOS transistor, said second high-melting point metal layer also being ohmically coupled with the second portion of said second polycrystalline layer and with the gate of said third MOS transistor, the drain of said first MOS transistor, and the drain of said second MOS transistor.

13. The semiconductor memory device according to claim 12, wherein the impurity in said first and second portions of the first polycrystalline silicon layer is of the same conductivity type as the impurity in said first and second portions of the second polycrystalline silicon layer.

14. The semiconductor memory device according to claim 13, wherein the impurity in said first and second portions of the first polycrystalline silicon layer and the second polycrystalline silicon layer is n type.

15. The semiconductor device according to claim 12, wherein the substrate region of said second MOS transistor is connected to said first metal interconnection layer, and the substrate region of said fourth MOS transistor is connected to said second metal interconnection layer.

16. The semiconductor memory device according to claim 12, wherein said first and second high-melting point metal layers are chosen from a group of tungsten, molybdenum, tantalum, titanium and platinum.

* * * * *